(12) United States Patent
Pe'er (10) Patent No.: US 9,349,476 B2
(45) Date of Patent: May 24, 2016

(54) METHODS, SYSTEMS, AND COMPUTER READABLE MEDIA FOR EARLY DETECTION OF POTENTIAL FLASH FAILURES USING AN ADAPTIVE SYSTEM LEVEL ALGORITHM BASED ON FLASH PROGRAM VERIFY

(71) Applicant: SanDisk Technologies Inc., Plano, TX (US)

(72) Inventor: Assaf Pe'er, Gedera (IL)

(73) Assignee: SanDisk Technologies Inc., Plano, TX (US)

( * ) Notice: Subject to any disclaimer, the term of this patent is extended or adjusted under 35 U.S.C. 154(b) by 233 days.

(21) Appl. No.: 13/773,570

(22) Filed: Feb. 21, 2013

(65) Prior Publication Data

US 2014/0237298 A1 Aug. 21, 2014

(51) Int. Cl.
*G11C 16/34* (2006.01)
*G11C 29/02* (2006.01)
*G11C 11/56* (2006.01)
*G11C 16/00* (2006.01)
*G11C 29/04* (2006.01)

(52) U.S. Cl.
CPC ........ *G11C 16/3418* (2013.01); *G11C 11/5628* (2013.01); *G11C 16/349* (2013.01); *G11C 29/021* (2013.01); *G11C 29/028* (2013.01); *G11C 16/00* (2013.01); *G11C 16/3495* (2013.01); *G11C 2029/0409* (2013.01); *G11C 2211/5621* (2013.01)

(58) Field of Classification Search
CPC . G06F 11/1072; G06F 1/1008; G06F 1/1068; G11C 16/349; G11C 16/3495
See application file for complete search history.

(56) References Cited

U.S. PATENT DOCUMENTS

| 7,477,547 | B2 | 1/2009 | Lin |
| 8,214,700 | B2 | 7/2012 | Chen |
| 8,255,772 | B1 * | 8/2012 | Foley ............................ 714/764 |
| 8,281,220 | B2 * | 10/2012 | Kitahara ....................... 714/764 |
| 8,321,727 | B2 * | 11/2012 | D'Abreu et al. .............. 714/718 |
| 2007/0297236 | A1 | 12/2007 | Tokiwa |
| 2008/0010566 | A1 * | 1/2008 | Chang et al. .................. 714/718 |
| 2010/0131809 | A1 * | 5/2010 | Katz ............................. 714/719 |
| 2010/0251075 | A1 * | 9/2010 | Takahashi et al. ............ 714/773 |
| 2010/0332895 | A1 * | 12/2010 | Billing et al. ..................... 714/8 |
| 2011/0099418 | A1 * | 4/2011 | Chen ............................ 714/6.24 |
| 2011/0302445 | A1 * | 12/2011 | Byom et al. ................... 714/6.1 |

OTHER PUBLICATIONS

Wikipedia's Flash Memory historical version from Feb. 17, 2013 http://en.wikipedia.org/w/index.php?title=Flash_memory&oldid=538768842.*

* cited by examiner

*Primary Examiner* — Joseph Schell
(74) *Attorney, Agent, or Firm* — Jenkins, Wilson, Taylor & Hunt, P.A.

(57) ABSTRACT

Methods, systems, and computer readable media for early detection of potential flash failures using an adaptive system level algorithm based on NAND program verify are disclosed. According to one aspect, a method for early detection of potential flash failures using an adaptive system level algorithm based on NAND program verify includes performing a program verify operation after a write to a non-volatile memory, where the program verify mechanism reports a pass or fail based on an existing measurement threshold value, and dynamically adjusting the measurement threshold value used by subsequent program verify operations based on the results of previous program verify operations.

39 Claims, 9 Drawing Sheets

| THRESHOLD | SUMMARY | EXPLANATION |
| --- | --- | --- |
| TH1 | EVALUATION WINDOW SIZE (NUMBER OF MB OF DATA WRITTEN BEFORE UPDATING BSPF) | NUMBER OF MB PER DIE WRITTEN SINCE LAST UPDATE OF BSPF VALUE. THIS THRESHOLD IS SET TO A HIGH VALUE TO ENABLE THE ALGORITHM TO INCREASE THE BSPF VALUE OF THE DIE QUICKLY ENOUGH TO PREVENT PERFORMANCE IMPACT OF TOO OFTEN FALSE EPD FAILURES. |
| TH2 | FALSE EPD TRIGGER COUNTER (NUMBER OF FAILURES BEFORE INCREASING SENSITIVITY) | NUMBER OF CONSECUTIVE FAILURES WITHIN THE EVALUATION WINDOW THAT WILL CAUSE AN INCREASE IN BSPF VALUE |
| TH3 | BSPF LOGGING THRESHOLD | VALUE OF BSPF ABOVE WHICH LOGGING OF FALSE FAILURES FOR SPECIFIC BLOCKS WILL BEGIN |
| TH4 | NUMBER OF FALSE FAILURES BEFORE RETIREMENT OF A BLOCK | THE NUMBER OF FALSE EPD FAILURES PER BLOCK WILL BE LOGGED STARTING WHEN TH3 EXCEEDS A THRESHOLD VALUE. IF A BLOCK HAS TH4 NUMBER OF FALSE FAILURES, THAT BLOCK IS RETIRED |
| TH5 | NUMBER OF RETIRED BLOCKS BEFORE DISABLING EPD FOR THE DIE | EPD IS DISABLED FOR DIES WITH >= TH5 ALREADY RETIRED BLOCKS. THIS PREVENTS MASSIVE BLOCK REPLACEMENTS DUE TO THE EPD ALGORITHM THAT MAY RESULT IN THE MEMORY BEING DRIVEN INTO "READ ONLY" MODE |

METHODS, SYSTEMS, AND COMPUTER READABLE MEDIA FOR EARLY DETECTION OF POTENTIAL FLASH FAILURES USING AN ADAPTIVE SYSTEM LEVEL ALGORITHM BASED ON FLASH PROGRAM VERIFY

TECHNICAL FIELD

The subject matter described herein relates to methods and systems for improving the reliability of flash memory storage devices. More particularly, the subject matter described herein relates to methods, systems, and computer readable media for early detection of potential flash failures using an adaptive system level algorithm based on flash program verify.

BACKGROUND

Flash memories contain one or more arrays of memory cells, which are organized into blocks. Each block is subdivided into pages. Data is written to flash memory in pages, i.e., the page is the smallest amount of memory that may be written at one time. Because the performance of flash memory degrades over time with repeated use, which may result in failure of the memory block and loss of data that had been stored there, it is desirable to identify blocks that are susceptible to future failure, before a failure and consequent loss of data occurs. One mode of failure of flash memory cells is the failure of the cell to be fully programmed during the write, i.e., the floating gate of the cell does not hold a correct amount of charge for the cell to be recognized as having a valid programmed value. This failure manifests itself as a cell having a programmed voltage that is not in the expected range, as illustrated in FIGS. 1 and 2.

Figure 1:
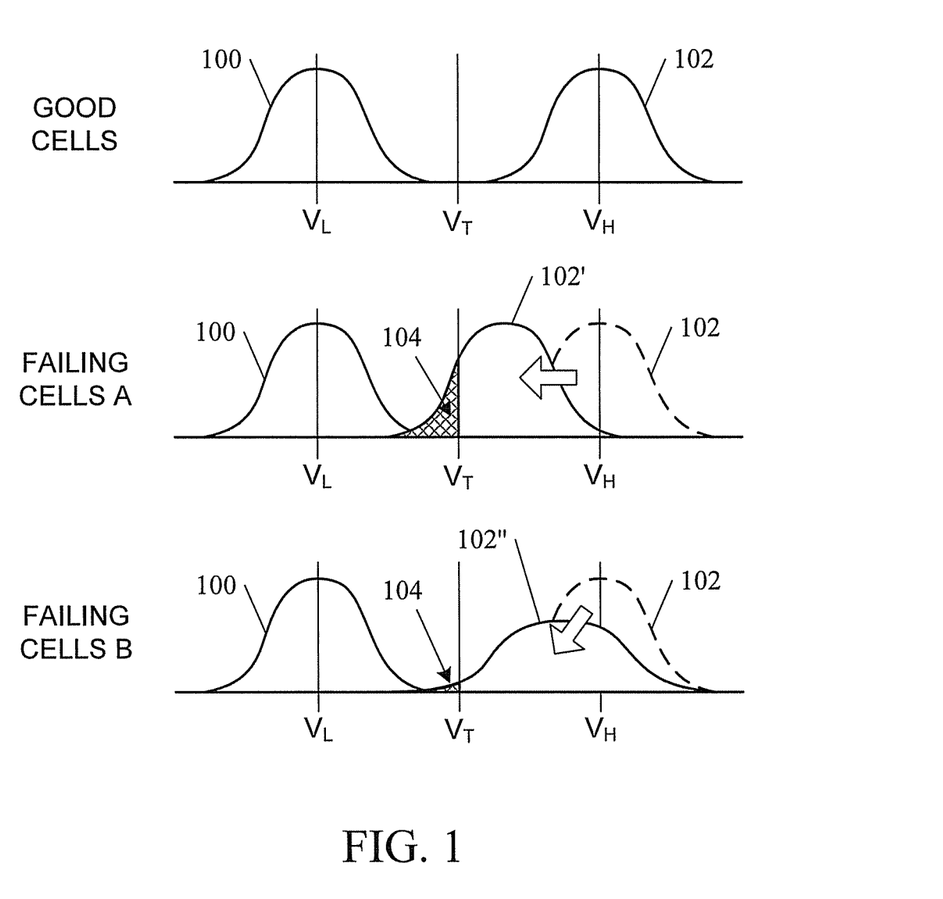
FIGS. 1 and 2 are graphs comparing the programmed values of a good flash memory cell group versus the programmed values of a failing flash memory cell group.

FIG. 1 is a graph comparing the programmed values of good cells versus the programmed values of failing cells. The top graph is a histogram showing the measured $V_T$ values of a group of good cells (e.g., a page) that are programmed to be either a logic L, which is centered around voltage $V_L$, or a logic H, which is centered around voltage $V_H$. Curves 100 and 102 show the distribution of measured values for $V_L$ and $V_H$, respectively. The middle graph is the same histogram, but showing the distribution of measured values for a group of failing cells A. In the middle graph, the failing cells' programmed values for $V_H$, shown as curve 102', are significantly shifted from the expected distribution of values shown by curve 102. As a result, some percentage of bits, indicated by hashed area 104, will fail to be programmed with a high enough voltage to be recognized as a logic H, e.g., these cells could not be programmed to a voltage higher than $V_T$. The bottom graph shows a different kind of $V_T$ distribution change. In the bottom graph, curve 102" shows that the distribution of programmed values for $V_H$ spans a wider range. This may indicate that not all cells in the group are aging in the same manner or at the same rate, e.g., some cells are still able to be programmed to a full $V_H$ value, while other cells are failing rapidly.

Figure 2:
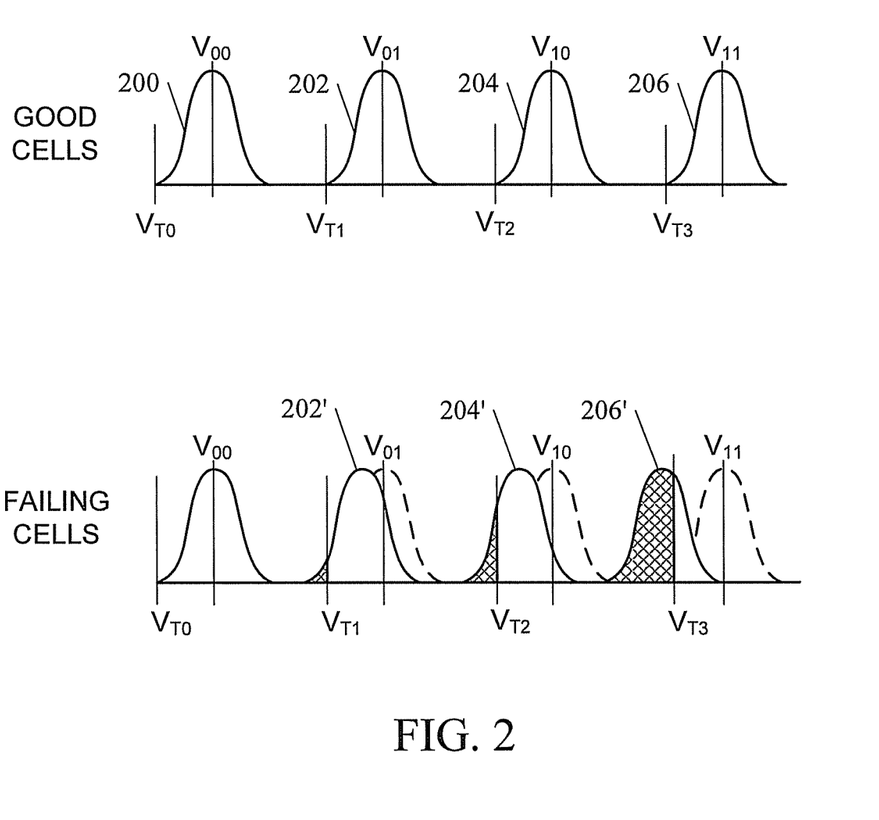

FIG. 2 is a graph comparing the programmed values of a group of good cells versus the programmed values of a group of failing cells, but for multi-level programmed cells. Unlike single-level cells, which have only target program values, $V_H$ and $V_L$, the multi-level cells shown in FIG. 2 may be programmed to one of four distinct program values, shown as $V_{00}$, $V_{01}$, $V_{10}$, and $V_{11}$. Curves 200, 202, 204, and 206 show expected distributions of programmed voltages for a group of normal cells. In this example, measurement thresholds $V_{T0}$ through $V_{T3}$ are used to check for a valid programmed value for levels $V_{00}$ through $V_{11}$, respectively. Curves 202', 204', and 206' illustrate example distributions of actual programmed values for a group of failing multi-level cells. As the actual programmed values shift, more and more bits register as program failures, as indicated by the hashed portions of the curves in FIG. 2. For example, curve 206' shows an example distribution of actual programmed values for a group of cells that failed to be programmed to the intended voltage value of $V_{11}$ and instead were programmed to a lower value. The hashed portion of curve 206' shows that some of the cells' programmed voltages were less than the threshold value $V_{T3}$. These cells will be read as having being programmed to $V_{10}$ instead of the intended value of $V_{11}$—a bit write failure.

One approach to dealing with failures of flash cells over time has been to perform erratic programming detection (EPD), in which, after a programming (i.e., writing data to) a page of flash memory, data is read from the just-written page and compared bit by bit (or cell by cell, in the case of multi-level cells, where each cell stores more than one bit of data) to data that is still present in the memory's write buffer. If the data that is read from the page matches the data that was written to the page, the EPD test returns a pass. For simplicity, the terms "failing bit" and "failing cell" will be used interchangeably, out of recognition that, even for multi-level cells, a programming failure will result in an incorrect bit value, e.g., a failing cell programmed to $V_{11}$ may return $V_{10}$, a failed bit, or $V_{00}$, two failed bits.

If the number of mismatched bits is greater than zero, that is not necessarily a fail, however. Since the failure of at least some of the bits of a large page of flash memory are inevitable, each page typically contains an error correction code (ECC) value stored along with the data. An ECC is designed to be able to correct only a certain number of bit failures, typically much less than the number of bits of data being stored in the page. For example, where an ECC can correct up to 100 bits of failure and where the EPD test detects that 50 bits of the page were not programmed correctly, the EPD test may return a pass, since the number of failing bits can be recovered via error correction. If the EPD test detects that more bits were programmed incorrectly than can be corrected by the ECC, the EPD test may return a fail.

Conventional EPD uses a value called the bit scan program failure (BSPF) value as the threshold that in essence determines how many bits of the page may fail to be programmed correctly before the EPD test returns a fail. For example, a BSPF value of 50 means that the EPD will return a fail if more than 50 bits were not programmed correctly. When the system detects an EPD failure, this triggers a recovery process. When EPD reports that a write to a page failed, the system may decide to treat the block containing the page as unreliable, and may need to determine whether to replace the failing block or not.

There are problems with the conventional EPD method, however. One problem is that the pass/fail threshold value used by conventional EPD methods (i.e., the BSPF value) is static. For example, a conventional implementation of EPD may use a dedicated register to store the BSPF value to be used by the EPD process, but the value stored in the dedicated register is set during production testing and never changed thereafter. Conventional EPD implementations have no mechanism to dynamically or automatically adjust the BSPF value over the lifetime of the memory device.

One problem with a static measurement threshold value, such as the BSPF value in the example above, is that if the value is too high, sensitivity is too low (e.g., the system allows too many failures before setting the trigger). As a result, by the time EPD starts reporting that a page is failing, the block containing that page may already degraded to the point that data written to other pages within that block may have already failed, for example, resulting in unrecoverable data loss. If the BSPF value is too low, sensitivity is too high (e.g., the system reports an error even though the number of bits that failed to be programmed correctly is relatively low.) This may generate a large number of false positives, which in turn may cause otherwise healthy sections of the flash die to be marked as unusable. Thus, setting the BSPF value too low will slow the system down due to frequent interruption by the EPD fail status requiring recovery and special treatment.

Another disadvantage of conventional systems is that the threshold values used to determine whether or not a cell has been successfully programmed are also static. For example, the thresholds $V_T$ in FIG. 1 and thresholds $V_{T0}$ through $V_{T3}$ in FIG. 2 are typically fixed and not adjusted dynamically. As a result, there is no mechanism to distinguish between failure profiles, such as the two different failure distributions shown in FIG. 1. Likewise, there is no mechanism to accommodate cells that are aging, but in a slow and predictable manner. For example, slight adjustments to the values of $V_{T0}$ through $V_{T3}$ in FIG. 2 could potentially extend the life of a slowly degrading flash memory.

Another consequence of the static thresholds used by conventional systems, whether that threshold is a failing bit count or a voltage threshold, is that, without the ability to dynamically adjust these thresholds, it is difficult if not impossible to collect information about how the rate of failures is changing over time, such as the speed at which distribution 102' is moving away from expected distribution 102, for example, or the speed at which distribution 102" is spreading with respect to expected distribution 102. In some cases how the distributions are trending over time is a better indicator of potential failure than a single value, or even a single snapshot of values.

Regardless of how program failures are detected or measured, different NAND die, different usage models and different wear out levels will all show changing levels of failure rates. Using a static algorithm to address the different behaviors may negatively affect system performance (triggering too often may interfere with system operation without providing a reliable prediction mechanism) or system reliability (utilizing an algorithm that will replace blocks based on an inadequate algorithm may result the replacement of too many blocks until the storage device or system becomes "read only".)

Accordingly, in light of these disadvantages associated with conventional, static algorithms for triggering EPD, there exists a need for early detection of potential flash failures using an adaptive system level algorithm based on flash program verify.

SUMMARY

According to one aspect, the subject matter described herein includes a method for early detection of potential flash failures using an adaptive system level algorithm based on NAND program verify. The method includes performing a program verify operation after a write to a non-volatile memory, where the program verify mechanism reports a pass or fail based on an existing measurement threshold value, and dynamically adjusting the measurement threshold value used by subsequent program verify operations based on the results of previous program verify operations, including the program verify operation just performed.

According to another aspect, the subject matter described herein includes a system for early detection of potential flash failures using an adaptive system level algorithm based on NAND program verify. The system includes: a non-volatile memory having multiple memory cells; a program verify circuit for performing a program verify operation after a write to a non-volatile memory, where the program verify mechanism reports a pass or fail based on an existing measurement threshold value; and a control circuit for dynamically adjusting the measurement threshold value used by subsequent program verify operations based on the results of previous program verify operations, including the program verify operation just performed.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, systems, methods, and computer readable media for early detection of potential flash failures using an adaptive system level algorithm based on NAND program verify are provided. Reference will now be made in detail to exemplary embodiments of the present invention, examples of which are illustrated in the accompanying drawings. Wherever possible, the same reference numbers will be used throughout the drawings to refer to the same or like parts.

To overcome the disadvantages of conventional designs, an algorithm to control a flash program verify mechanism is presented that dynamically adjusts based on margins or tolerances and/or the number or frequency of errors detected. In one embodiment, the flash program verify mechanism may include the EPD criteria, or could measure other characteristics such as the magnitude of programmed voltage deviations, the number of programmed voltage deviations, etc. This allows the algorithm to adapt to changes in flash behavior due to endurance and data retention over the life of the device, by changing the error detection criteria over time.

Figure 3A:
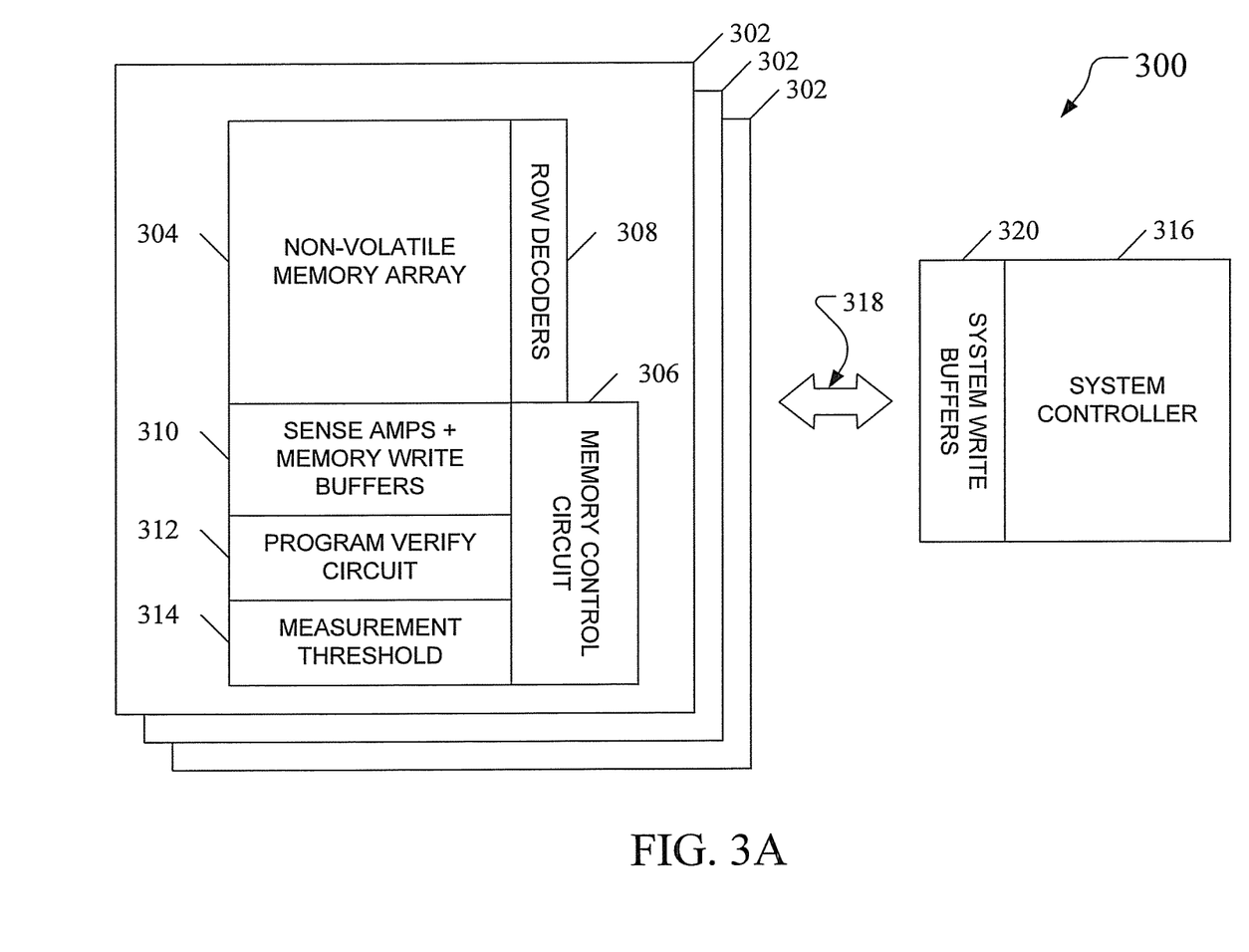
FIG. 3A is a block diagram of an exemplary system for early detection of potential flash failures using an adaptive system level algorithm based on NAND program verify according to an embodiment of the subject matter described herein.
Figure 3B:
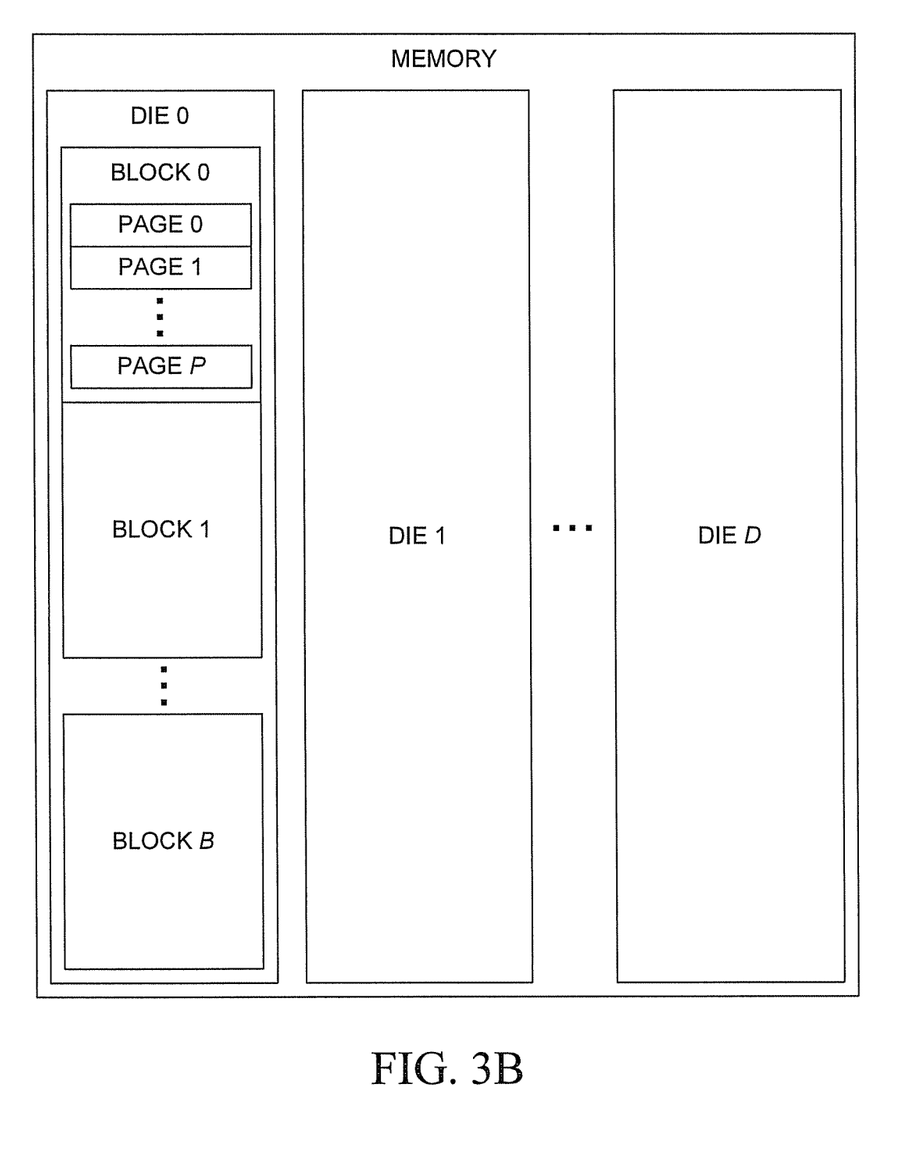
FIG. 3B is a block diagram showing the logical organization of an exemplary non-volatile memory array according to an embodiment of the subject matter described herein.

FIG. 3A is a block diagram of an exemplary system for early detection of potential flash failures using an adaptive system level algorithm based on NAND program verify according to an embodiment of the subject matter described herein. In the embodiment illustrated in FIG. 3A, system 300 includes one or more memory subsystems 302, each subsystem containing a non-volatile memory array 304. FIG. 3B is a block diagram showing the logical organization of an exemplary non-volatile memory array according to an embodiment of the subject matter described herein. In the embodiment illustrated in FIG. 3B, the system memory includes multiple dies, labeled die 0 through die D. Each die is divided into blocks, labeled block 0 through block B. Each block is further divided into pages, labeled page 0 through page P. Thus, in one embodiment, the memory cells of the non-volatile memory are organized into pages, the pages are organized into blocks, and the blocks occupy one or more chip die.

Referring again to FIG. 3A, each subsystem 302 may also include a memory control circuit 306, which triggers a program verify operation after a write to the non-volatile memory, where the program verify operation reports a pass or fail based on a measurement threshold value. In one embodiment, each memory control circuit 306 is NAND die specific. In alternative embodiments, there can be multiple memory control circuits per die, etc.

In one embodiment, memory array 304 includes row decoders 308 and sense amplifiers 310. In the embodiment illustrated in FIG. 3A, sense amplifiers 310 include write buffers that store the write data and maintain that data after the write operation is complete.

In one embodiment, system 300 includes a program verify circuit 312 for performing the program verify operation and returning a pass or fail result based on a measurement threshold. In the embodiment illustrated in FIG. 3A, each memory subsystem 302 has its own program verify circuit 312, but in alternative embodiments, a program verify circuit may be shared by multiple memory subsystems 302, each subsystem 302 may have multiple program verify circuits, and so on. Thus, in one embodiment, control circuit 306 may dynamically adjust measurement thresholds per page, per block, per die, or some combination. In the embodiment illustrated in FIG. 3A, a measurement threshold register 314 stores and maintains the measurement threshold used by program verify circuit 312.

System 300 may also include a system controller 316 that reads data from or writes data to the memory subsystem(s) 302 via a bus 318 or other type of interface suitable for transferring data. In one embodiment, system controller 316 traces the history of failures and dynamically adjusts the measurement threshold value to be used by subsequent program verify operations based on the results of previous program verify operations, including the program verify operation just performed. In an alternative embodiment, some or all of these functions could be performed by control circuit 306 instead, or by system controller 316 and control circuit 306 in combination.

In the embodiment illustrated in FIG. 3A, system controller 316 includes a system write buffer 320 which stores data to be written to memory.

In one embodiment, the program verify operation may be an EPD operation that reports a pass or fail based on whether or not of the number of bits that failed to be programmed correctly exceeds a value defined by a bit scan program failure (BSPF) value. In the embodiment illustrated in FIG. 3A, for example, program verify circuit 312 and measurement threshold register 314 may be an EPD circuit for performing the EPD operation and a BSPF register, respectively. In one embodiment, program verify circuit 312 may compare data stored in the just-written to page (P) within memory array 302 to the data still stored in write buffers 310 to determine the number of bits of page P that were not programmed correctly. If the number of failed bits exceeds the BSPF value in measurement threshold register 314, program verify circuit 312 reports a fail result to memory control circuit 306.

In one embodiment, memory control circuit 306 may report this result to system controller 316, which may then instruct memory control circuit 306 to adjust the BSPF value stored in measurement threshold register 314 based on the results of the EPD test just performed, and may also consider results of previous EPD tests other than the EPD test just performed. In another embodiment, for example, memory control circuit 306 may control the adjustment of the BSPF without assistance from system controller 316.

In another embodiment, the program verify operation may measure programmed voltage ($V_P$) values of the just-programmed cells and compare the measured $V_P$ to a $V_T$ value or range of $V_T$ values stored in measurement threshold register 314. If the $V_P$ is not in the expected range defined by $V_T$, program verify circuit 312 may return a fail.

In one embodiment, system controller 316 may then select an action based on how far $V_P$ is out of the expected range. For example, if $V_P$ is just slightly out of range, system controller 316 may adjust the values of $V_T$ stored in measurement threshold register 314 to expand the range of $V_P$ values that are considered a pass. On the other hand, if $V_P$ is significantly out of range, this may trigger system controller 316 to begin a data recovery process. This may also trigger system controller 316 to start collecting statistics about the cell, page, block, or die that failed. Over time, system controller 316 can use this information to identify cells, pages, blocks, or die that show trends of $V_P$ changes that indicate potential failure. The examples described herein are intended for illustration and are not limiting. For example, in alternative embodiments, some or all of the functions performed by system controller 316 may be performed by memory control circuit 306 instead.

Figure 4:
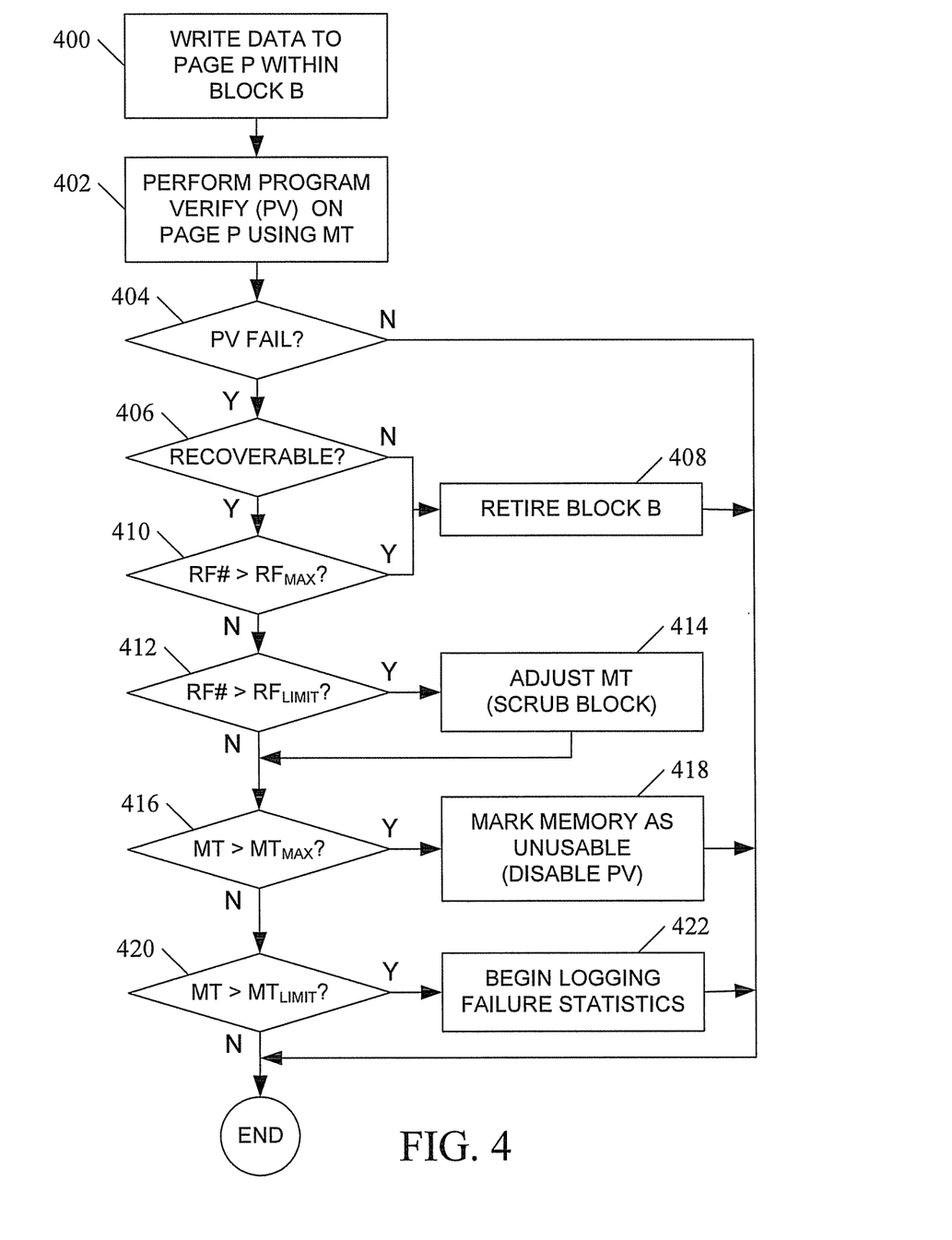
FIG. 4 is a flow chart illustrating an exemplary process for early detection of potential flash failures using an adaptive system level algorithm based on NAND program verify according to an embodiment of the subject matter described herein.

FIG. 4 is a flow chart illustrating an exemplary process for early detection of potential flash failures using an adaptive system level algorithm based on NAND program verify according to an embodiment of the subject matter described herein.

At step 400, data is written to a page (P) within a block (B) of flash memory. In system 300, for example, data may be written to non-volatile memory array 302.

At step 402, a program verify test is performed on page P, using the current measurement threshold value. In system 300, for example, program verify circuit 312 may compare data read from page P with data still stored in write buffers 308 and determine whether the number of bits that failed to program correctly exceeds the current value stored in measurement threshold register 314.

At step 404, the method determines whether the program verify returned a pass or fail result. In the embodiment illustrated in FIG. 3A, for example, program verify circuit 312 may report a pass or fail based on a check performed using values that are stored in measurement threshold storage block 314. If the program verify returned a pass, the process ends. If the program verify returned a fail, however, the process goes to step 406. The remaining steps of this process, including step 406, may be performed by system controller 316, by memory control circuit 306, by other circuits, or by some combination of the above.

At step 406, the method determines whether or not the write failure is recoverable. In embodiments where EPD is the program verify operation, for example, the threshold value BSPF may be set to a number that is less than the number of bits that may be corrected by ECC. In this case, EPD may return a fail, but the data may still be recovered using ECC, which is referred to as a "recoverable fail". In one embodiment, in order to determine whether or not the failure is recoverable, the just-written data may be read back to the host or controller, such as system controller 316 in FIG. 3, which attempts to perform an error correction operation, e.g., using the ECC portion of the page to correct the data portion of the page. A successful error correction indicates that the failure is recoverable, and an unsuccessful error correction indicates that the failure is not recoverable. In the embodiment illustrated in FIG. 4, if the failure is recoverable, the process goes to step 410, which will be described below. If the failure is not recoverable, the process goes to step 408.

At step 408, the just-written-to block B is retired, e.g., marked as unusable. From step 408 the process ends. The process may be triggered again by the next write to the non-volatile memory. In one embodiment, retiring a block may include maintaining the just written page data in a system write buffer 320 so that it is not lost, while copying data from the block being retired to a different block. The page data still maintained in system write buffer 320 is then stored to the new block as well. The retired block is then marked as unusable.

At step 410, the method compares the number of recoverable failures detected for the block (RF#) to a maximum number of recoverable failures ($RF_{MAX}$) allowed for a block. If $RF\# > RF_{MAX}$, the process goes to step 408, where the block is retired; otherwise, the process goes to step 412. Thus, in the embodiment illustrated in FIG. 4, a block may be retired if there has been an unrecoverable failure, but may also be retired if the number of recoverable failures has exceeded a threshold value $RF_{MAX}$. In other words, too many recoverable failures may also indicate excessive wear or potential failure, which may trigger the system to take active steps to avoid future data loss.

At step 412, the number of recoverable failures detected is compared to a recoverable failure threshold limit ($RF_{LIMIT}$). If $RF\# > RF_{LIMIT}$, the process goes to step 414. Otherwise, the process goes to step 416.

At step 414, if the number of recoverable failures has exceeded a recoverable failure threshold limit, the value of measurement threshold MT is adjusted. In embodiments that use EPD, for example, the value of BSPF may be increased, which decreases the sensitivity of the EPD test. Alternatively, in embodiments that measure or check $V_P$ values, the $V_T$ values may be adjusted, e.g., to relax the tolerances of the test.

In other embodiments, the sensitivity of the program verify method may be increased, rather than decreased, under certain conditions. For example, where measured failures asymptotically approach a critical limit, the resolution of the measurement mechanism may be increased, e.g., at the expense of the range of measurement.

MT may be adjusted when the number of failures exceeds a threshold, when the number of failures per unit time exceeds a threshold, when the number of failures per amount of data written exceeds a threshold, or some combination.

In one embodiment, the detection of a threshold number of recoverable failures may trigger a system block scrub, or data refresh, on the block, to improve the general reliability of the data in the failing location. For example, data from the block may be copied to another block or temporary storage location, after which the block is completely erased one or more times. The data is then copied back to the block. This corrects a problem where data that has been stored in the block begins to lose its storage value over time, e.g., due to slow leakage of charges from the memory cell floating gates. Performing the block scrub restores the data values to their programmed states, e.g., recharges the floating gates to their proper $V_P$.

At step 416, the current value of the measurement threshold is compared to a maximum measurement threshold, $MT_{MAX}$. If MT exceeds $MT_{MAX}$, the process goes to step 418; otherwise, the process goes to step 420.

At step 418, an MT that exceeds a maximum value $MT_{MAX}$ may indicate that failure is imminent for that page, block, or die, and thus the system may mark the page, block, or die as unusable, and the process ends. In embodiments that use EPD, for example, $MT_{MAX}$ could be the maximum number of failed bits that can still be corrected by ECC. Using the example above, in which ECC can correct up to 100 failed bits in a page, $MT_{MAX}$ could be equal to 100. Thus, if MT (e.g., BSPF) is greater than $MT_{MAX}$ (e.g., 100), the memory may be marked as unusable. Alternatively, in embodiments that measure $V_P$, the memory may be marked as unusable when the threshold limit $V_T$ for a measured logic value begins to enter a voltage range reserved for other logic values.

The amount of memory that is marked as unusable in this situation would depend on the scope of the measurement threshold. In embodiments where each die has its own BSPF value, for example, a BSPF value higher than $MT_{MAX}$ would cause that die to be marked as unusable, while other dies having BSPF values less than MTMAX would still be in use. Likewise, in embodiments where each block has its own BSPF value, a BSPF value higher than $MT_{MAX}$ could cause that particular block to be marked as unusable.

In one embodiment, the portion of memory that is marked as unusable could be marked as completely unusable, e.g., a bad or failed page, block, or die, e.g., read and write access to that memory is disabled. Alternatively, if it appears that the data within the memory is stable, that portion of memory could be marked as read-only, e.g., write access to that memory is disabled, but read-access is allowed.

In one embodiment, when MT exceeds $MT_{MAX}$, it may make sense to disable all subsequent program verify operations for that die or other portion of memory, based on the recognition that subsequent program verify operations may generate an increasingly larger number of additional failures, which could trigger a flurry of block retirements, which themselves might fail, and thus create a possible cascade of failures. For this reason step 418 includes the optional action of disabling PV for the memory. When this occurs, all subsequent writes would include step 400 only, i.e., the flow would go from step 400 directly to "END", since PV is no longer performed.

At step 420, the current value of the measurement threshold does not exceed a maximum, but is still checked against a measurement threshold limit, $MT_{LIMIT}$. If MT is still within this measurement threshold limit, the process ends. Otherwise, the process goes to step 422. In embodiments that use EPD, for example, the value of BSPF may be checked to determine whether the number of failed bits defined by BSPF is approaching the maximum number of bits that can be corrected by ECC. Continuing the example above, where ECC can correct up to 100 bit failures in a page, $MT_{LIMIT}$ may be a number such as 50. In embodiments that use VP, for example, $MT_{LIMIT}$ may represent a $V_T$ value that approaches a voltage boundary separating one logical value from another logical value. The use of $MT_{LIMIT}$ allows a system the flexibility to forestall logging and its resource overhead until the device behavior indicates that logging is warranted.

At step 422, the value of MT being maintained for the page, block, or die has been adjusted to a value that indicates that there may be a potential problem, and so the system begins (or continues) logging failure statistics for the page, block, and/or die. Example statistics include, but are not limited to, keeping track of the number of recoverable failures that have been detected for a block, e.g., RF#, used above.

Statistics may be kept at any level of hierarchy—cell, page, block, die, subsystem, system, etc. In one embodiment, for example, the system may collect failure information at the block level rather than at the page level. In the embodiment illustrated in FIG. 3A, memory array 304 is divided into blocks, which are further divided into pages. In the embodiment of the method illustrated in FIG. 4, EPD may be performed on individual pages, but if a page shows an unrecoverable failure, the entire block is retired.

Likewise, measurement thresholds may be kept at any level of hierarchy. In one embodiment, measurement thresholds, such as BSPF, are kept for each die, and when a BSPF value reaches a threshold, the system may begin collecting statistics for each block. In this manner, when a program verify failure occurs, the RF# check in step 410 may use statistics collected for the block, rather than the page, to make decisions about whether to retire the block or increase the value of BSPF for the die. It is noted, however, that the subject matter described herein applies to other approaches as well, including applying the principles described herein at the page, block, or die level (or other levels as appropriate.)

The adaptive algorithms described herein improve EPD detection and early defect detection by setting the lowest EPD thresholds possible without getting too frequent false failures (e.g., failures that do not require a recovery process as result of an immediate risk to the data.) The algorithm can increase the thresholds under specific conditions to reduce the number of false failures while refreshing data on other blocks or retiring blocks under specific conditions. The adaptive manner in which the algorithm operates allows each NAND die will have its own trigger level to: identify potentially bad Flash blocks early and replace them before they introduce a reliability risk as result of a future potential unrecoverable failure; identify cases where data refresh is required to lower risk to existing data; prevent system level performance drop as result of getting frequent EPD type program failures which require special handling; prevent overly-frequent EPD program failure triggers that could cause excessive block replacement; and allow feature disablement of specific die when required.

Upon getting an EPD failure event, the adaptive algorithm may operate in several ways according to a set of operations, including:

Ignore failure, e.g., where the failure rate is low enough and does not burden system performance and there is no sign of immediate potential risk to data;

Retire the failing block, e.g., where there are signs of risk to data integrity that is identified by an immediate read to Flash addresses that are at risk, or where there is repeated failure on a specific block that may be an early sign for a physical defect;

Increase the EPD threshold in Flash (BSPF_EPD register setting), e.g., to avoid performance impact as result of too frequent EPD failures;

Disable EPD on the specific die, e.g., to avoid performance impact as result of too frequent EPD failures after maxing out on the EPD threshold or after exceeding a threshold of block replaces that the system can sustain without impact on reliability or performance; and Trigger system block scrub (data refresh) on the block, e.g., to improve the general reliability of the data in the failing location.

The adaptive approach described herein has several thresholds that could be set during characterization stages of the specific NAND technology or as part of the runtime algorithm. Although the thresholds described below are applied to systems and methods that use EPD as the program verify mechanism, the same concepts may be applied to other program verify mechanisms, including those that measure $V_P$.

Figure 5:
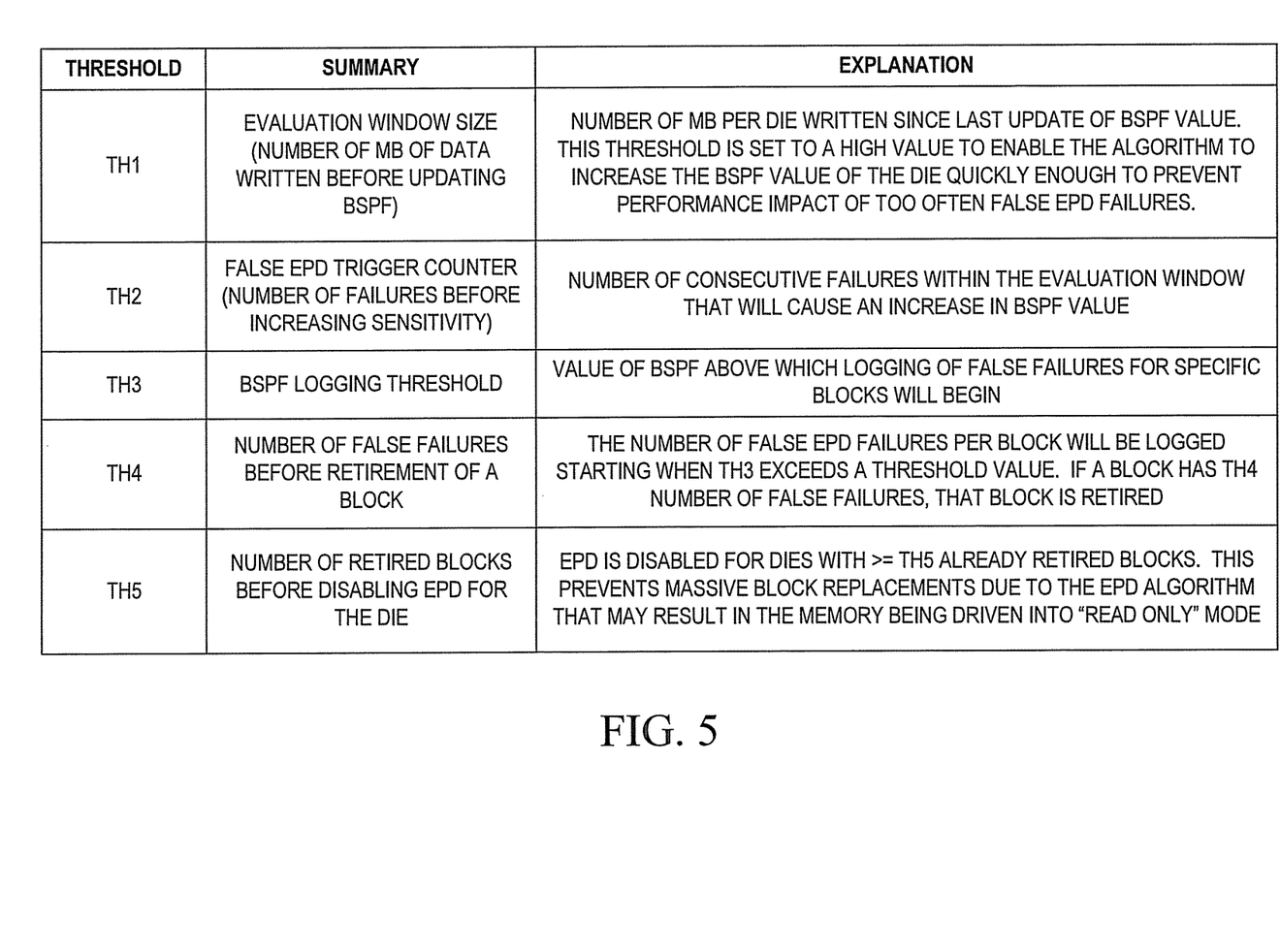
FIG. 5 is a table illustrating thresholds that may be used in an exemplary algorithm for early detection of potential flash failures using an adaptive system level algorithm based on NAND erratic programming detection (EPD) according to an embodiment of the subject matter described herein.

FIG. 5 is a table illustrating thresholds that may be used in an exemplary algorithm for early detection of potential flash failures using an adaptive system level algorithm based on NAND erratic programming detection (EPD) according to an embodiment of the subject matter described herein. These thresholds could be adaptively calculated based on specific die behavior. In one embodiment, a first threshold (TH1) may define the size of an evaluation window that must be considered before BSPF can be updated. The size of an evaluation window may be defined in terms of time, amount of data processed, a combination of the two, etc. A second threshold (TH2) may define the number of recoverable EPD failures that must be detected before changing the value of BSPF. A third threshold (TH3) may represent the value of BSPF above which logging of false EPD failures for each block will begin. A fourth threshold (TH4) may define the number of recoverable EPD failures that trigger the system to retire block in question. A fifth threshold (TH5) may define the number of blocks that may be retired on a die before the system disables further EPD testing on that die. Using TH5 allows the system to avoid a crash caused by excessive loss of blocks. TH5 may be used to detect another condition that will disable EPD when the system identifies a possibly colossal problem and wants to prevent recovery attempts and further replacement of block. The thresholds described herein are intended to be illustrative and not limiting. Other kinds of thresholds could be defined and dynamically changed as appropriate.

Figure 6A:
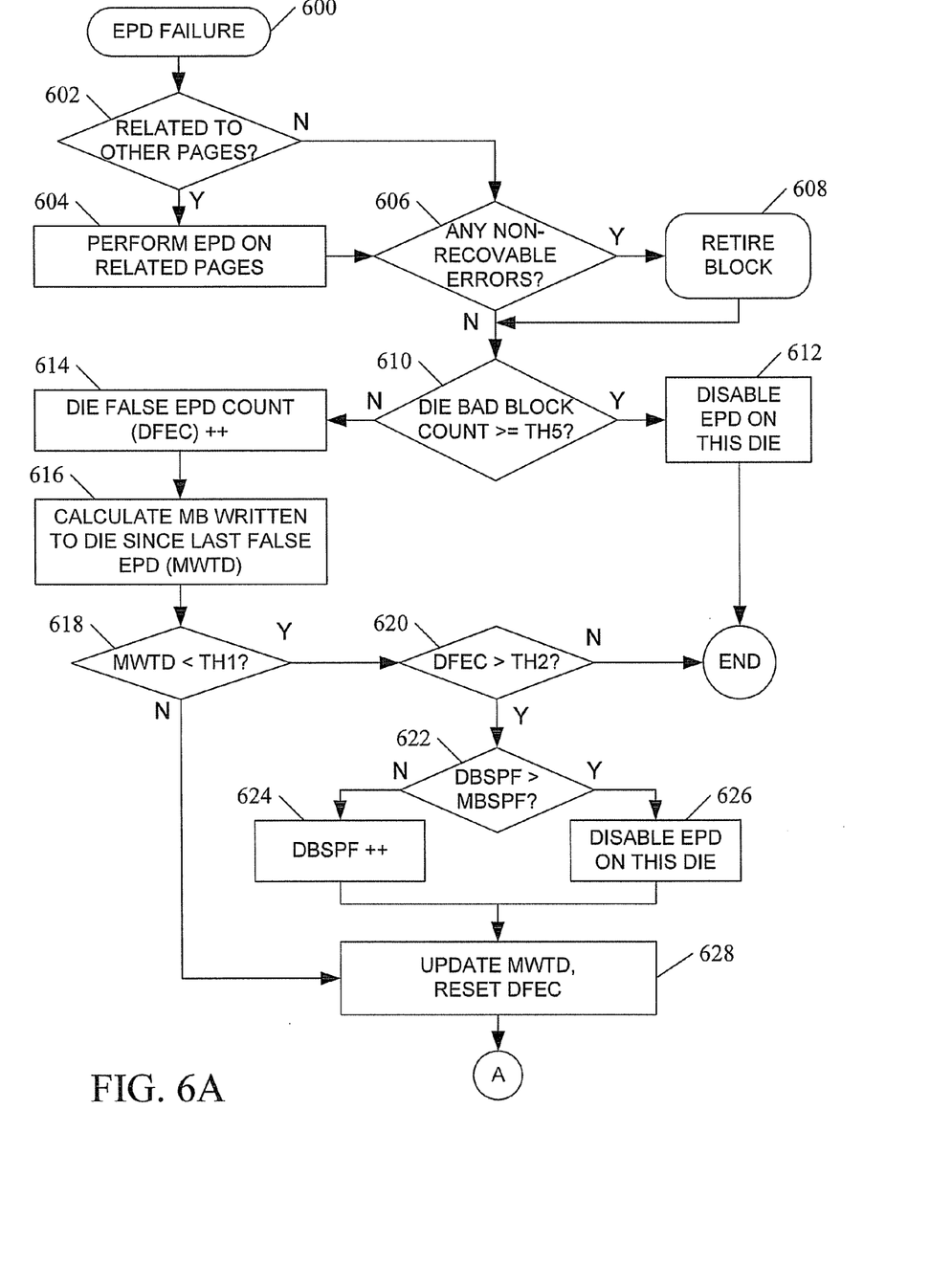
FIGS. 6A, 6B, and 6C are flow charts illustrating an exemplary process for early detection of potential flash failures using an adaptive system level algorithm based on NAND erratic programming detection (EPD) according to another embodiment of the subject matter described herein.
Figure 6B:
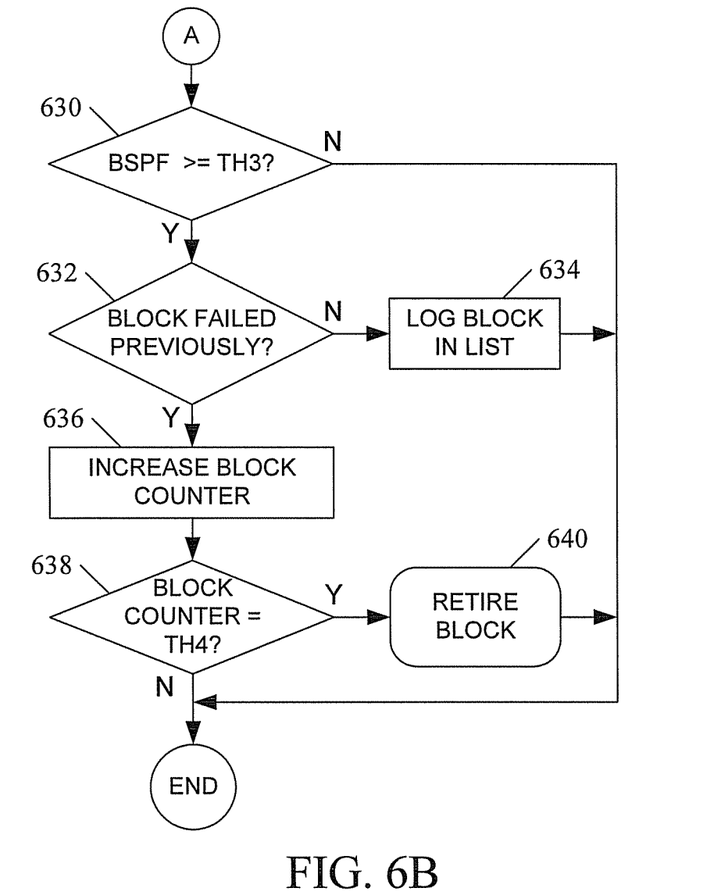
Figure 6C:
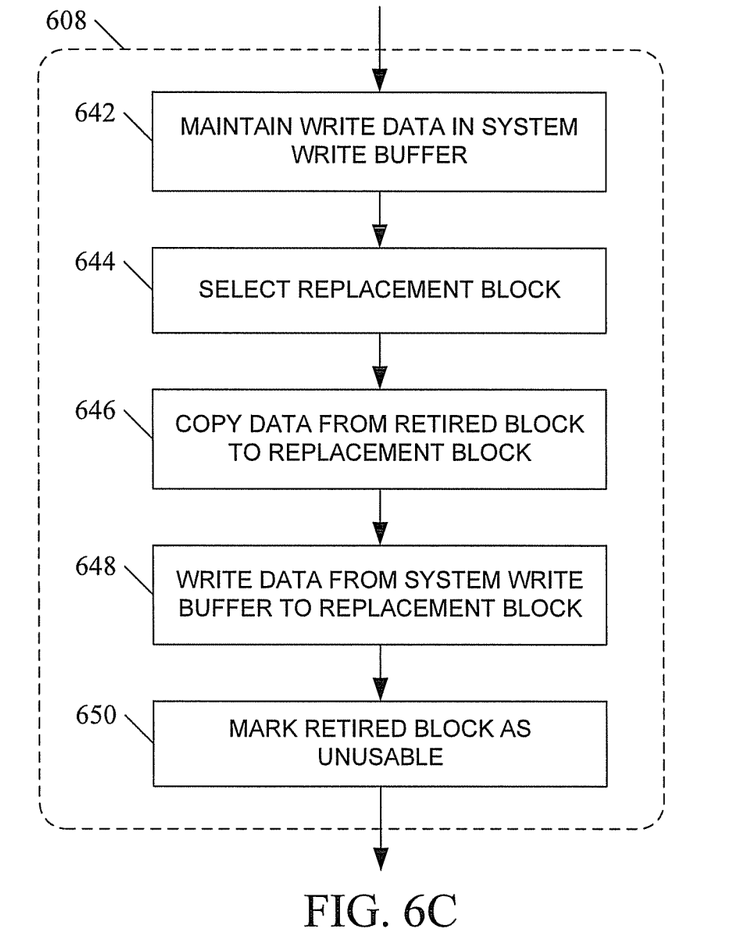

FIGS. 6A, 6B, and 6C are flow charts illustrating an exemplary process for early detection of potential flash failures using an adaptive system level algorithm based on NAND erratic programming detection (EPD) according to another embodiment of the subject matter described herein.

In FIG. 6A, the process is triggered by an EPD failure 600. At step 602, the system determines whether the failed page is related to other pages, e.g., physically contiguous pages, pages that share a word line, etc., and if so, performs an EPD or other verification step on the related pages.

At step 606, the system checks to see if any non-recoverable errors (e.g., the data cannot be corrected using the ECC) were reported. In the embodiment illustrated in FIG. 3A, for example, step 606 and other steps may be performed by system controller 316, memory control circuit 306, other circuits, or some combination. If so, the process performs block recovery (step 608), which is shown in more detail in FIG. 6C, and involves marking a block as bad. Otherwise, the process moves to step 610.

At step 610, the number of bad blocks on the current die is compared to threshold TH5. If the number of bad blocks equals or exceeds the limit defined by TH5, then at step 612, EPD for that die is disabled, and the process ends. Otherwise, the process moves to step 614, in which the die false EPD count (DFEC) is incremented.

In the embodiment illustrated in FIGS. 6A and 6B, the system does not increment a measurement threshold unless it has detected a certain number of false EPDs within what is referred to as the evaluation window. An evaluation window may be defined in terms of time, amount of data received, some combination of the two, etc. In this example, the evaluation window is defined as a number of megabytes (MBs) of data written. Thus, at step 616, the system calculates how many megabytes of data have been written to die since the last false EPD, herein referred to as "MWTD".

At step 618, MWTD is compared to the evaluation window size defined by TH1. If MVVTD<TH1, then the evaluation window is still open and the process goes to step 620. Otherwise, the evaluation window is closed and the process goes to step 628, which will be described below.

At step 620, the process checks to see if the number of recoverable failures has exceeded the false EPD count limit defined by threshold TH2. If not, the process ends. Otherwise, the process goes to step 622.

At step 622, the BSPF value for the particular die (DBSPF) is compared to the maximum BSPF value allowed for any die (MBSPF). If DBSPF has not yet exceeded MBSPF, the current value for BSPF for the die is incremented, at step 624. If DBSPF for the die has exceeded the maximum BSPF value allowed, EPD is disabled for that die, at step 626. In either case, the process then goes to step 628.

At step 628, MWTD is updated, and DFEC is reset. From here, the process continues in FIG. 6B.

Referring now to FIG. 6B, at step 630, the BSPF for the particular die is compared to the BSPF logging threshold defined by TH3. If the value of DBSPF does not exceed TH3, the process ends. If the value of DBSPF exceeds TH3, however, the system will begin (or continue) logging statistics for each block. Thus, at step 632, it is determined if statistics on the block are already being logged, e.g., that the block has failed previously. If the block is not in the list already, e.g., the block has not failed previously, then the block is added to the list, at step 634, and the process ends. If the block is in the list already, the block counter is incremented, at step 636. The process then goes to step 638.

At step 638, the block DFEC count exceeds the threshold number of false failures allowed before retiring a block defined by TH4, that block is retired, at step 640. If the block count does not exceed threshold TH4, the process ends.

FIG. 6C describes the block retirement/block recovery process in more detail. At step 642, the system maintains the data that was just written to the failing page, e.g., in the system write buffer. The system then selects a replacement block (step 644), copies data from the retired block to the replacement block (step 646), and stores the previously unsuccessfully written data to the replacement block as well (step 648), e.g., writes to a page in the replacement block data currently being maintained in the system write buffer. The retired block is then marked as being unusable (step 650.)

The process illustrated in FIGS. 6A through 6C is not intended to be limiting, and illustrates the point that dynamic calculation of EPD thresholds (e.g., BSPF values and other thresholds defined by TH1~TH5) allow early detection of potential flash failures before the flash blocks in question reach the point of unrecoverable failures. By setting (and dynamically adjusting) BSPF values used by EPD, insight into the health of the flash memory may be obtained and tracked. The concepts described herein allow this valuable information to be obtained while at the same time minimizing the impact that such monitoring has on system performance. For example, dynamic manipulation of BSPF values can reduce the number of false EPD failures reported, while tracking the number of false failures reported on a block-by-block basis can give early warning that a particular block is trending towards a failure.

In one embodiment, the values for thresholds such as TH1~TH5 may be predetermined and/or set to reasonably productive values, while still allowing for the values to change and adapt as the device ages. In the embodiments described above, the adaptive parts of the algorithm are the BSPF values that are increased per die and the enablement and disablement of the whole EPD feature per die, but other values may also be dynamically adjusted. For example, flexibility could be increased by defining some of the predetermined thresholds (TH1-5) as adaptive and set by the system based on each die's behavior under EPD detection.

The subject matter described herein provides several significant advantages over conventional program verify implementations, such as: provides early detection of potential flash issues and weak blocks; may be implemented in NAND testing level as well as with hard limits to improve Flash screens; provides an adaptive mechanism that can accommodate changes in or across wafer or manufacturing processes, die to die variances, and different wear levels. In addition, thresholds may be identified based on both NAND behavior and system level limitations, such as performance requirements, number of bad blocks allowed before intervention is required, and so on.

Moreover, the subject matter described herein imposes minimal additional performance impact, and may improve the performance of a non-volatile memory system. For example, the subject matter described above can adjust the sensitivity of the program verify test to mask false program verify failures and thus avoid the overhead associated with verifying whether the program verify failure is recoverable or not, performing block recovery when not really necessary, and so on.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for early detection of potential flash failures using an adaptive system level algorithm based on NAND program verify, the method comprising:

performing a program verify operation after a write to a page within a block of a non-volatile memory, wherein the program verify operation reports a pass or failure based on whether a number of bits failing to be written correctly from a buffer to the page in the non-volatile memory exceeds an existing measurement threshold value; and dynamically adjusting the existing measurement threshold value used by subsequent program verify operations based on results of previous program verify operations, wherein dynamically adjusting the existing measurement threshold value includes determining that the program verify operation has reported the failure, and, in response to determining that the program verify operation has reported the failure:
   determining whether the failure is recoverable;
   in response to determining that the failure is recoverable, determining whether a number of recoverable failures for the block has exceeded a first program verify limit; and
   in response to determining that the number of recoverable failures for the block has exceeded a first program verify limit, adjusting the existing measurement threshold value.

2. The method of claim 1 wherein the non-volatile memory comprises memory cells organized into at least one page, at least one page organized into at least one block, and at least one block occupying at least one die.

3. The method of claim 2 wherein dynamically adjusting the measurement threshold value comprises at least one of:
   dynamically adjusting a threshold per page;
   dynamically adjusting a threshold per block; and
   dynamically adjusting a threshold per die.

4. The method of claim 1 wherein determining whether the failure is recoverable comprises reading data associated with the write and attempting to perform an error correction operation, wherein a successful error correction operation indicates that the failure is recoverable and an unsuccessful error correction operation indicates that the failure is not recoverable.

5. The method of claim 1 comprising, in response to determining that the number of recoverable failures has exceeded a first program verify limit, performing a data scrub to refresh the data stored within a portion of memory that contains the detected failure.

6. The method of claim 1 wherein determining whether the number of recoverable failures has exceeded a first program verify limit comprises determining whether the number of recoverable failures during a specified measurement period has exceeded a threshold failure rate.

7. The method of claim 1 comprising, in response to adjusting the measurement threshold, determining whether the adjusted measurement threshold exceeds a first measurement threshold limit, and, in response to determining that the adjusted measurement threshold exceeds a first measurement threshold limit, starting to count the number of program verify failures reported for a portion of the memory, wherein, upon a detection that the number of program verify failures reported for the portion of the memory exceeds a second program verify limit, the portion of the memory is marked as unusable.

8. The method of claim 7 comprising, in response to adjusting the measurement threshold, determining whether the adjusted measurement threshold exceeds a second measurement threshold limit, and, in response to determining that the adjusted measurement threshold exceeds a second measurement threshold limit, performing at least one of:
   disabling the program verify operation for at least a portion of the non-volatile memory;
   disabling write access to at least a portion of the non-volatile memory; and
   disabling read access to at least a portion of the non-volatile memory.

9. The method of claim 1 wherein adjusting the measurement threshold comprises adjusting the measurement threshold to adjust sensitivity of the program verify method.

10. The method of claim 1 comprising, in response to determining that the failure is not recoverable, marking a portion of the memory that contains failing cells as unusable.

11. The method of claim 1 comprising saving the data associated with the write to a different portion of memory not marked as unusable.

12. The method of claim 1 further comprising:
   identifying a portion of the memory for which the program verify operation has reported a fail;
   copying data from the identified portion to another portion of the memory; and
   storing the data associated with the write in the other portion of the memory.

13. The method of claim 1 wherein the program verify operation reports a pass or fail based on a number of memory cells that were not successfully programmed during the write.

14. The method of claim 13 wherein the program verify operation reports a fail when the number of memory cells that were not successfully programmed during the write exceeds the measurement threshold value.

15. The method of claim 14 wherein performing a program verify operation comprises performing a NAND erratic programming detection (EPD) and wherein the measurement threshold value comprises a bit scan program failure (BSPF) value.

16. The method of claim 1 wherein the program verify operation reports a pass or fail based on a measured programmed voltage value of a cell that was a target of the write.

17. The method of claim 16 wherein dynamically adjusting the measurement threshold value used by subsequent program verify operations comprises dynamically adjusting a voltage threshold used to determine whether the cell was successfully programmed or not.

18. The method of claim 1 wherein the program verify operation reports a pass or fail based on a distribution of measured programmed voltage values of cells that were targets of the write.

19. The method of claim 18 wherein dynamically adjusting the measurement threshold value used by subsequent program verify operations comprises dynamically adjusting measurement threshold values used to characterize the distribution of measured programmed voltage values of cells that were targets of the write.

20. The method of claim 13 wherein the program verify circuit reports a fail when the number of memory cells that were not successfully programmed during the write exceeds a measurement threshold value.

21. The method of claim 14 wherein the program verify circuit performs a NAND erratic programming detection (EPD) and wherein the measurement threshold value comprises a bit scan program failure (BSPF) value.

22. A system for early detection of potential flash failures using an adaptive system level algorithm based on NAND program verify, the system comprising:
   a non-volatile memory, comprising a plurality of memory cells;
   a program verify circuit for performing a program verify operation after a write to a page within a block of the non-volatile memory, wherein the program verify operation reports a pass or failure based on whether a number of bits failing to be written correctly from a buffer to the page in the non-volatile memory exceeds an existing measurement threshold value; and
   a control circuit for dynamically adjusting the existing measurement threshold value used by subsequent program verify operations based on results of previous program verify operations by determining that the program verify operation has reported the failure, and, in response to determining that the program verify operation has reported the failure:

determining whether the failure is recoverable;

in response to determining that the failure is recoverable, determining whether a number of recoverable failures for the block has exceeded a first program verify limit; and in response to determining that the number of recoverable failures for the block has exceeded a first program verify limit, adjusting the existing measurement threshold value.

23. The system of claim 22 wherein the non-volatile memory comprises memory cells organized into at least one page, at least one page organized into at least one block, and at least one block occupying at least one die.

24. The system of claim 23 wherein the control circuit dynamically adjusts at least one of:

a measurement threshold value per page;

a measurement threshold value per block; and a measurement threshold value per die.

25. The system of claim 22 wherein determining whether the failure is recoverable comprises reading data associated with the write and attempting to perform an error correction operation, wherein a successful error correction operation indicates that the failure is recoverable and an unsuccessful error correction operation indicates that the failure is not recoverable.

26. The system of claim 22 wherein, in response to determining that the number of recoverable failures has exceeded a first program verify limit, a data scrub to refresh the data stored within a portion of memory that contains the detected failure is performed.

27. The system of claim 22 wherein determining whether the number of recoverable failures has exceeded a first program verify limit comprises determining whether the number of recoverable failures during a specified measurement period has exceeded a threshold failure rate.

28. The system of claim 22 wherein the control circuit, in response to adjusting the measurement threshold, determines whether the adjusted measurement threshold exceeds a first measurement threshold limit, and, in response to determining that the adjusted measurement threshold exceeds a first measurement threshold limit, starts to count the number of program verify failures reported for a portion of the memory, wherein, upon a detection that the number of program verify failures reported for the portion of the memory exceeds a second program verify limit, the portion of the memory is marked as unusable.

29. The system of claim 28 comprising, in response to adjusting the measurement threshold, determining whether the adjusted measurement threshold exceeds a second measurement threshold limit, and, in response to determining that the adjusted measurement threshold exceeds a second measurement threshold limit, performing at least one of:

disabling the program verify operation for at least a portion of the non-volatile memory;

disabling write access to at least a portion of the non-volatile memory; and disabling read access to at least a portion of the non-volatile memory.

30. The system of claim 22 wherein adjusting the measurement threshold comprises adjusting the measurement threshold to adjust sensitivity of the program verify method.

31. The system of claim 22 wherein the control circuit, in response to determining that the failure is not recoverable, marks a portion of the memory that contains failing cells as unusable.

32. The system of claim 31 wherein the control circuit saves the data associated with the write to a different portion of memory not marked as unusable.

33. The system of claim 22 wherein the control circuit is configured to:

identify a portion of the memory for which the program verify operation has reported a fail;

copy data from the identified portion to another portion of the memory; and store the data associated with the write in the other portion of the memory.

34. The system of claim 22 wherein the program verify circuit reports a pass or fail based on a number of memory cells that were not successfully programmed during the write.

35. The system of claim 22 wherein the program verify circuit reports a pass or fail based on a measured programmed voltage value of a cell that was a target of the write.

36. The system of claim 35 wherein dynamically adjusting the measurement threshold value used by subsequent program verify operations comprises dynamically adjusting a voltage threshold used to determine whether the cell was successfully programmed or not.

37. The system of claim 22 wherein the program verify circuit reports a pass or fail based on a distribution of measured programmed voltage values of cells that were targets of the write.

38. The system of claim 37 wherein dynamically adjusting the measurement threshold value used by subsequent program verify operations comprises dynamically adjusting measurement threshold values used to characterize the distribution of measured programmed voltage values of cells that were targets of the write.

39. A non-transitory computer readable medium having stored thereon executable instructions that when executed by the processor of a computer control the computer to perform steps comprising:

performing a program verify operation after a write to a page within a block of a non-volatile memory, wherein the program verify operation reports a pass or failure based on whether a number of bits failing to be written correctly from a buffer to the page in the non-volatile memory exceeds an existing measurement threshold value; and dynamically adjusting the existing measurement threshold value used by subsequent program verify operations based on results of previous program verify operations, wherein dynamically adjusting the existing measurement threshold value includes determining that the program verify operation has reported the failure, and, in response to determining that the program verify operation has reported the failure:

determining whether the failure is recoverable;

in response to determining that the failure is recoverable, determining whether a number of recoverable failures for the block has exceeded a first program verify limit; and in response to determining that the number of recoverable failures for the block has exceeded a first program verify limit, adjusting the existing measurement threshold value.

* * * * *